United States Patent
Lewis et al.

(10) Patent No.: US 6,630,842 B1
(45) Date of Patent: Oct. 7, 2003

(54) ROUTING ARCHITECTURE FOR A PROGRAMMABLE LOGIC DEVICE

(75) Inventors: David M. Lewis, Toronto (CA); Paul Leventis, Toronto (CA); Andy L. Lee, San Jose, CA (US); Brian D. Johnson, Sunnyvale, CA (US); Richard Cliff, Los Altos, CA (US); Srinivas T. Reddy, Fremont, CA (US); Christopher F. Lane, San Jose, CA (US); Cameron R. McClintock, Mountain View, CA (US); Vaughn Betz, Toronto (CA); Chris Wysocki, Toronto (CA); Alexander R. Marquardt, Toronto (CA)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 10/140,287

(22) Filed: May 6, 2002

Related U.S. Application Data

(60) Provisional application No. 60/289,176, filed on May 6, 2001, and provisional application No. 60/334,236, filed on Nov. 28, 2001.

(51) Int. Cl.[7] ............................................. H03K 19/177
(52) U.S. Cl. ........................................... 326/41; 326/38
(58) Field of Search ..................................... 326/37–41

(56) References Cited

U.S. PATENT DOCUMENTS

| | | | |
|---|---|---|---|
| 4,870,302 A | 9/1989 | Freeman | 307/465 |
| 5,243,238 A | 9/1993 | Kean | 307/465 |

(List continued on next page.)

OTHER PUBLICATIONS

Kluwer Academic Publishers, Vaughn Betz, Jonathan Rose, Alexander Marquardt, *Architecture and CAD for Deep–Submicron FPGAs*, Chapter 2.1 (pp. 11–18), Chapter 4 (pp. 63–103), Chapters (pp. 105–126), and Chapter 7 (pp. 151–190), (Mar. 1999).

*Primary Examiner*—Don Le
(74) *Attorney, Agent, or Firm*—Morrison & Foerster LLP

(57) ABSTRACT

An embodiment of this invention pertains to a 3-sided routing architecture to interconnect function blocks, such as logic array blocks ("LABs"), within a programmable logic device ("PLD"). In the 3-sided routing architecture, inputs and outputs on a first side of a function block connect to a first channel, and inputs and outputs on a second side of the function block connect to a second channel where the second side is opposite the first side. Inputs and outputs on a third side of the function block connect to a third channel. A fourth channel associated with a fourth side of the function block, the fourth side opposite the third side, is coupled only to the first channel and the second channel. In one configuration, the inputs and outputs on each of the first side, the second side, and the third side have an equal number of inputs and outputs. In this configuration, each of the first channel, the second channel, and the third channel have the same width. In another configuration, the number of pins on one of the first side, the second side, or the third side differs from the number of pins on another one of those sides. In this configuration, the width of one of the first channel, the second channel, or the third channel differs from the width of another one of those channels. Input multiplexers route signals from the wires of the channels to the inputs of the function block. Output multiplexers and drivers drive the outputs of the function block through the wires of the channels. By placing the input multiplexers and the output multiplexers in certain relative arrangements, the logical distance that an output signal from the function block can travel on a wire is increased and that signal can be looped back to itself. In addition, each of the inputs and the outputs of the function block can be connected to both horizontal and vertical channels, and an output of the function block can be directly connected to an input of an adjacent function block.

75 Claims, 9 Drawing Sheets

U.S. PATENT DOCUMENTS

| | | | |
|---|---|---|---|
| 5,260,611 A | 11/1993 | Cliff et al. | 307/465 |
| 5,455,525 A | 10/1995 | Ho et al. | 326/41 |
| 5,485,103 A | 1/1996 | Pedersen et al. | 326/41 |
| 5,537,057 A | 7/1996 | Leong et al. | 326/41 |
| 5,541,530 A | 7/1996 | Cliff et al. | 326/41 |
| 5,581,199 A | 12/1996 | Pierce et al. | 326/41 |
| 5,592,106 A | 1/1997 | Leong et al. | 326/41 |
| 5,682,107 A | 10/1997 | Tavana et al. | 326/41 |
| 5,689,195 A | 11/1997 | Cliff et al. | 326/41 |
| 5,701,091 A | 12/1997 | Kean | 326/41 |
| 5,705,939 A | 1/1998 | McClintock et al. | 326/41 |
| 5,847,579 A | 12/1998 | Trimberger | 326/41 |
| 5,880,598 A | 3/1999 | Duong | 326/41 |
| 5,907,248 A | 5/1999 | Bauer et al. | 326/39 |
| 5,909,126 A | 6/1999 | Cliff et al. | 326/41 |
| 5,914,616 A | 6/1999 | Young et al. | 326/41 |
| 5,942,913 A | 8/1999 | Young et al. | 326/41 |
| 6,084,429 A | 7/2000 | Trimberger | 326/41 |
| 6,107,824 A | 8/2000 | Reddy et al. | 326/41 |
| 6,204,690 B1 | 3/2001 | Young et al. | 326/41 |
| 6,278,291 B1 | 8/2001 | McClintock et al. | 326/41 |
| 6,292,018 B1 | 9/2001 | Kean | 326/41 |
| 6,300,794 B1 | 10/2001 | Reddy et al. | 326/41 |

Prior Art Routing Architectures

Non-extended Reach

Extended Reach

Mixed Reach

Non-extended Reach LABs: LAB 560, LAB 561, LAB 562, and LAB 563
Extended Reach LABs: LAB 561, LAB 562, LAB 563, and LAB 564

Electronic System
801

ROUTING ARCHITECTURE FOR A PROGRAMMABLE LOGIC DEVICE

CROSS-REFERENCE TO RELATED APPLICATIONS

This application claims the benefit of U.S. Provisional Application Ser. No. 60/289,176, May 6, 2001, and entitled "Three-Sided Routing Architecture," and also claims the benefit of U.S. Provisional Application Ser. No. 60/334,236, filed Nov. 28, 2001, and entitled "PLD Architecture with Different Pin Densities and Routing Concentrations on Different Sides of the LAB."

BACKGROUND OF THE INVENTION

1. Field of the Invention

This invention relates generally to integrated circuits and, in particular, to improved routing architectures for a programmable logic device.

2. Description of the Related Art

A programmable logic device ("PLD") is a digital, user-configurable integrated circuit used to implement a custom logic function. For the purposes of this description, the term PLD encompasses any digital logic circuit configured by the end-user, and includes a programmable logic array ("PLA"), a field programmable gate array ("FPGA"), and an erasable and complex PLD. The basic building block of a PLD is a logic element that is capable of performing logic functions on a number of input variables. A logic element is typically equipped with circuitry to programmably implement the "sum of products" logic or look-up table logic, as well as one or more registers to implement sequential logic. Conventional PLDs combine together large numbers of such logic elements through an array of programmable interconnects to facilitate implementation of complex logic functions. PLDs have found particularly wide application as a result of their combined low up front cost and versatility to the user.

A variety of PLD architectural approaches arranging the interconnect array and logic elements have been developed to optimize logic density and signal routability between the various logic elements. The logic elements are arranged in groups of, for example, eight to form a larger logic array block ("LAB"). Multiple LABs are arranged in a two dimensional array and are programmably connectable to each other by programmably connecting the inputs and outputs of each LAB to horizontal and vertical interconnect channels.

Continuous advances in semiconductor manufacturing technology have made possible integration of increasingly larger numbers of gates on a chip. Each new generation of PLDs is designed with an appreciably higher logic density. Often the transition to the next generation requires new PLD architectures. One design feature that is subject to reevaluation for new and higher density PLDs is the routing architecture used to interconnect the LABs. There are four types of routing architectures currently being used for a LAB within the PLD: a 1-sided architecture, a 1½-sided architecture, a 2-sided architecture, and a 4-sided architecture.

FIG. 1 shows the prior art 2-sided architecture, 1½-sided architecture, and 1-sided architecture. Routing channels are located above, below, to the left, and to the right side of each LAB. The routing channel may run in the horizontal direction (i.e., a horizontal channel) or the vertical direction (i.e., a vertical channel). In the 2-sided routing architecture, a LAB 120 transmits and receives signals to and from a H-channel 123a and a V-channel 126b but does not transmit or receive signals from a V-channel 126a and a H-channel 126b. In the 1½-sided routing architecture, a LAB 140 transmits and receives signals from a H-channel 143a but only transmits signals to a V-channel 146 and does not transmit or receive signals from a V-channel 146a and a H-channel 143b. In a 1-sided routing architecture, a LAB 160 transmits and receives signals from a H-channel 163a but does not transmit or receive signals from a H-channel 163b, a V-channel 166a and a V-channel 166b.

FIG. 1 also shows a symmetrical 4-sided architecture where a LAB 100 is coupled to all four of the routing channels. The LAB 100 transmits and receives signals to and from a H-Channel 103a, a H-channel 103b, a V-channel 106a, and a V-channel 106b. Switches (i.e., a switch 110a, a switch 110b, a switch 110c, and a switch 110d) couple the horizontal channels (i.e., a H-channel 103a and a H-channel 103b) with the vertical channels (i.e., a V-channel 106a and a V-channel 106b). The symmetrical 4-sided architecture has characteristics such as that the number of input pins and output pins on all four sides of the LAB are the same. The routing channels (e.g., the horizontal channels and the vertical channels) also have the same widths, e.g., the number of wires in the horizontal channels is the same as the number of wires in the vertical channels. This symmetrical architecture forces the LAB to have a square layout and maintain the square layout as the number of logical elements within the LAB increases. Maintaining the symmetrical number of pins and channel widths may cause inefficiency. For example, the optimum number of logic elements in the LAB may dictate that the LAB not have a square layout with symmetrical characteristics. Also, if redundancy is supported such that a defective row or column of LABs is replaceable, then it would be inefficient to have the same number of routing resources (e.g., multiplexers and drivers) on both the horizontal channels and the vertical channels.

The 2-sided architecture, the 1½-sided architecture, and the 1-sided architecture can all support redundancy. However, because the number of channels that a LAB within these architectures connect to are fewer than the LAB 100 of the 4-sided architecture, the LAB in the 2-sided architecture, the 1½-sided architecture, or the 1-sided architecture generally takes a longer time to transmit a signal to another LAB resulting in the PLD having a slower circuit speed (e.g., the delay for the transmitted signal to reach the intended LAB is generally greater in the 2-sided architecture, the 1½-sided architecture, and the 1-sided architecture than the 4-sided architecture). When a LAB connects to fewer channels, that LAB has fewer number of other LABs that it can connect to using a single routing wire. In general, the fewer the number of other LABs that can be connected to using a single routing wire, the greater the time required to transmit a signal to another LAB. For example, in FIG. 1, using single wires that each can reach another LAB a distance of up to four LABs away, a LAB in the 4-sided architecture can connect to 44 other LABs, however, a LAB in the 1-sided architecture can connect only to 8 other LABs, a LAB in the 1½-sided architecture can connect only to 12 other LABs, and a LAB in the 2-sided architecture can connect only to 16 other LABs.

For the foregoing reasons, it is desirable to have a routing architecture that maximizes the number of channels to which a particular LAB can connect and may have asymmetric characteristics.

SUMMARY OF THE INVENTION

According to an embodiment of the present invention, an integrated circuit is described. The integrated circuit includes a function block that has multiple inputs and multiple outputs. The integrated circuit includes a first channel coupled to a first portion of the multiple inputs located on a first side of the function block and is also coupled to a first portion of the multiple outputs located on the first side of the function block. The integrated circuit also includes a second channel coupled to a second portion of the multiple inputs located on a second side of the function block where the second side is opposite the first side. The second channel is also coupled to a second portion of the multiple outputs located on the second side of the function block.

The integrated circuit includes a third channel coupled to the first channel and the second channel and coupled to a third portion of the multiple inputs located on a third side of the function block and coupled to a third portion of the multiple outputs located on the third side of the function block. The integrated circuit also includes a fourth channel associated with a fourth side of the function block that is opposite the third side. The fourth channel is coupled only to the first channel and the second channel.

Within the integrated circuit, there is at least one of: (a) a difference between any two of a number of inputs of the first, second, or third portion of the multiple inputs, (b) a difference between any two of a number of outputs of the first, second, or third portion of the multiple outputs, and (c) a difference between any two of the number of inputs combined with the number of outputs of the first, second, or third portion of the multiple inputs and outputs.

DETAILED DESCRIPTION OF THE INVENTION

Figure 1:
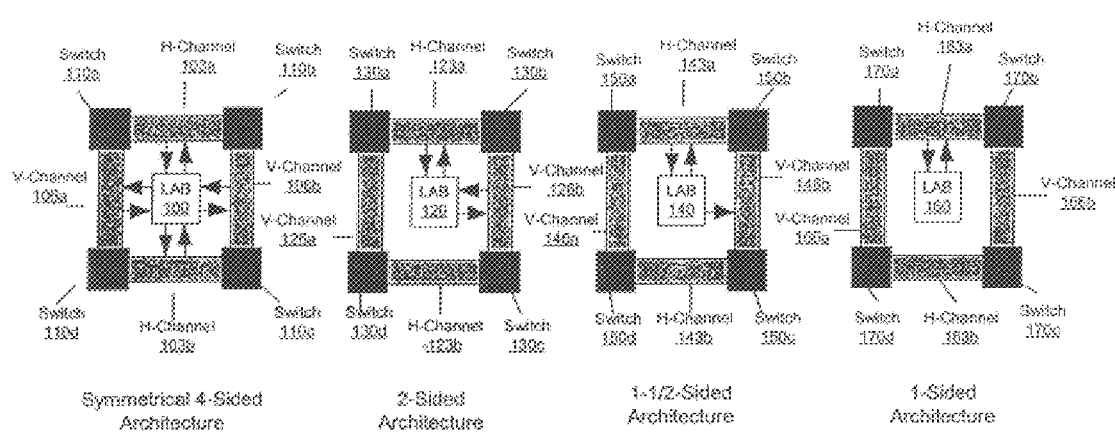
FIG. 1 shows prior art 1-sided architecture, 1½-sided architecture, 2-sided architecture and symmetrical 4-sided architecture that are currently implemented in PLDs.

The routing architecture for the PLD provides input and output connections between a function block (e.g., the LAB, a memory block, an input/output block, an arithmetic logic unit, or a multiply-accumulate block) and horizontal and vertical channels. In one embodiment of the present invention, a function block is programmably coupled to two channels that are disposed on opposite sides of the function block (e.g., a first vertical channel disposed on the left or right side of the function block and a second vertical channel disposed on the opposite side of the function block) and another channel disposed on a third side of the function block (e.g., a horizontal channel disposed on the top side of the function block). The function block can transmit and receive signals from all three of these channels. This configuration is referred to herein as a 3-sided routing architecture.

In order to provide concrete examples, the remainder of this document refers to the 3-sided routing architecture as having the function block couple to one horizontal channel and two vertical channels, however, this embodiment includes other variations such as where the function block couples to one vertical channel and two horizontal channels. Also, in order to provide concrete examples, the remainder of the document employs LABs, however, this embodiment includes the use of other types of function blocks. In addition, when a connection is described below, that connection includes a programmable connection such as static random-access memory, dynamic random-access memory, electrically erasable programmable read-only memory, flash, fuse, and antifuse programmable connections. The programmable connection could also be implemented through mask programming during the fabrication of the device. The mask programming may be useful in certain high volume applications.

In this embodiment, a LAB includes a collection of logic elements, LAB lines that carry signals generated outside the LAB, local lines that carry signals generated by logic elements within the LAB, logic element input multiplexers that programmably select inputs from the LAB lines and local lines and provide these as inputs to the logic elements, and logic element output multiplexers that output signals of the logic elements to the local lines or to the inputs of multiplexers that together with corresponding drivers drive the routing wires outside the LAB.

Other input multiplexers route signals from the routing wires in the channels to the LAB lines. Output multiplexers and drivers drive the outputs of the LAB (e.g., the outputs of the logic elements within the LAB) through the routing wires within the channels outside the LAB. By positioning the input multiplexer and the output multiplexer in certain relative arrangements, the advantages achieved include: (1) increase in the logical distance that an output signal from the LAB can travel on a wire; (2) an input pin or an output pin of the LAB can connect to wires on two different channels; (3) the output signals from the LAB can drive onto different wires on a horizontal channel in more than one logical position; and (4) the output from the LAB can be connected directly into the input multiplexer of an adjacent LAB without using any additional wires in the channels.

The 3-sided routing architecture supports redundancy (the symmetrical 4-sided architecture does not support redundancy) and allows access to a greater number of channels than the 2-sided architecture, the 1½-sided architecture, or the 1-sided architecture. This greater access reduces the time to send a signal from one LAB to a destination LAB thus maximizing the PLD speed. Increasing the number of channels connected to by a LAB results in a greater likelihood that the LAB can send the signal to the destination LAB using a shorter connection. In general, the shorter the connection, the faster the signal reaches the destination LAB.

Figure 2A:
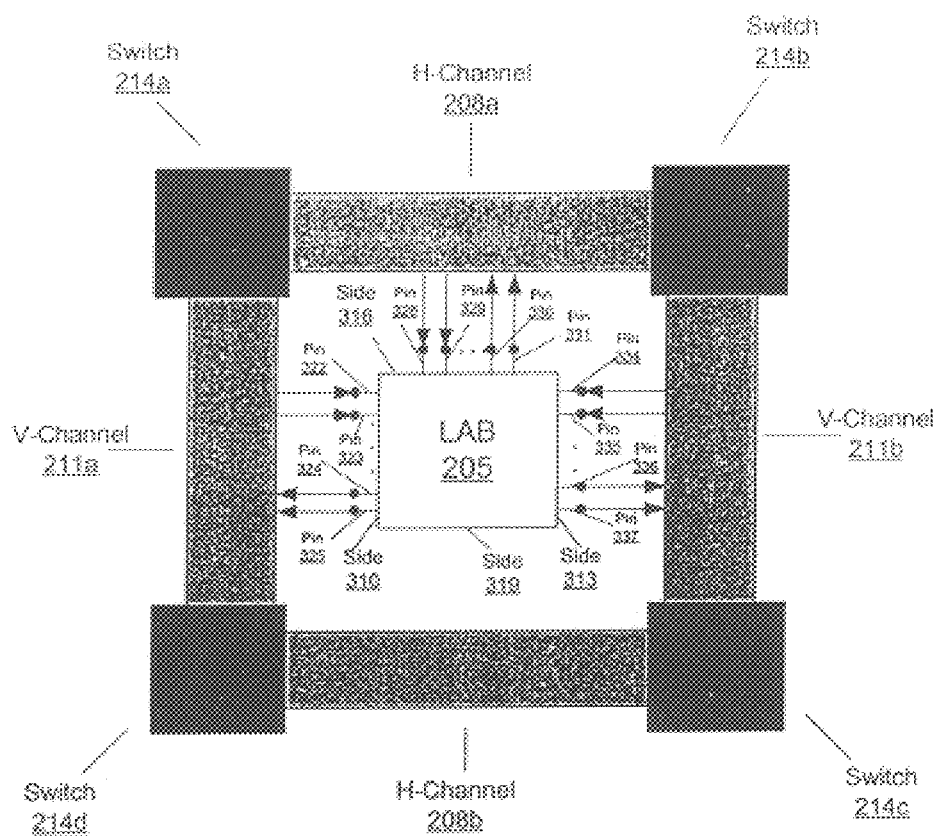
FIG. 2a shows an example of an embodiment of a 3-sided routing architecture according to the present invention.

FIG. 2a shows an example of an embodiment of a 3-sided routing architecture according to the present invention. In FIG. 2a, a H-channel 208a is disposed on a side 316 of a LAB 205 and input pins 328, 329 on the side 316 of the LAB 205 are connected to the H-channel 208a. Output pins 330, 331 on the side 316 are also connected to the H-Channel 208a. A V-channel 21 Ia is disposed on a side 310 of the LAB 205 and input pins 322, 323 on the side 310 are connected to the V-channel 211a. Output pins 324, 325 on the side 310 are also connected to the V-channel 211a. A V-channel 211b is disposed on a side 313 of the LAB 205 and input pins 334, 335 on the side 313 are connected to the V-channel 211b. Output pins 336, 337 on the side 313 are also connected to the V-channel 211b. A H-channel 208b is disposed on a side 319 of the LAB 205. The LAB 205 is not coupled to the H-channel 208b. Using the input pins and the output pins, the LAB 205 receives signals from and transmits signals to the H-Channel 208a, the V-Channel 211a, and the V-Channel 211b. The connection of the LAB 205 to the H-channel 208a, the V-channel 211a, and the V-channel 211b are for example purposes only; in general terms, the LAB 205 is connected to two channels disposed on opposite sides of the LAB and also connected to another channel disposed on another side of the LAB. Since modern devices are manufactured on multiple layer technology, the interconnect structure is normally, but need not be, above the logic rather than actually being disposed to one side of the logic. These channels allow the LAB 205 to communicate with other LABs. A switch 214a, a switch 214b, a switch 214c, and a switch 214d couple the vertical and horizontal channels together. Each of these switches may be any electrical switch such as a pass transistor, a buffer and a pass transistor, or a multiplexer and a buffer directly driving the routing.

In a first configuration, each of the sides 310, 313, 316 of the LAB 205 has an equal number of pins. Pins, as used herein, refers to input pins on a side of the LAB 205 that receive data or output pins on a side of the LAB 205 that transmit data. In this configuration, each of the channels 208a, 211a, 211b have the same width (i.e., the same number of wires within the channel).

In a second configuration, the number of pins on one of the sides 310, 313, 316 of the LAB 205 differs from the number of pins on another one of those sides of the LAB. Having different number of pins on any two of the sides 310, 313, 316 of the LAB 205 includes the following three cases: (1) the number of input pins combined with the number of output pins on one of those sides differs from the number of input pins combined with the number of output pins on another one of those sides, (2) the number of input pins on one of those sides differs from the number of input pins on another one of those sides, and (3) the number of output pins on one of those sides differs from the number of output pins on another one of those sides. For example, in FIG. 2a, the side 316 of the LAB 205 may have 30 pins that transmit and receive signals to and from the H-channel 208a and the side 310 may have 10 pins that transmit and receive signals from the V-channel 211a and the side 313 may have 10 pins that transmit and receive signals from the V-channel 211b.

In the second configuration, the width of one of the channels 211a, 211b, 208a disposed on the corresponding one of the sides 310, 313, 316 of the LAB 205 differs from the width of another one of those channels. For example, the width of the H-channel 208a may be greater than the width of the V-channel 211a or the width of the V-channel 211b because, for example, there are more pins to couple to on the side 316 of the LAB 205 than the side 310 or the side 313 of the LAB 205.

The wires in each routing channel (e.g., the H-channel 208a, the V-channel 211a, and the V-channel 211b) may either be staggered, such that wires of a given length have starting points that are spread uniformly along the length of the channel, or non-staggered, such that the starting and end points of a collection of wires are aligned to occur at the same point along the length of the channel.

Figure 2B:
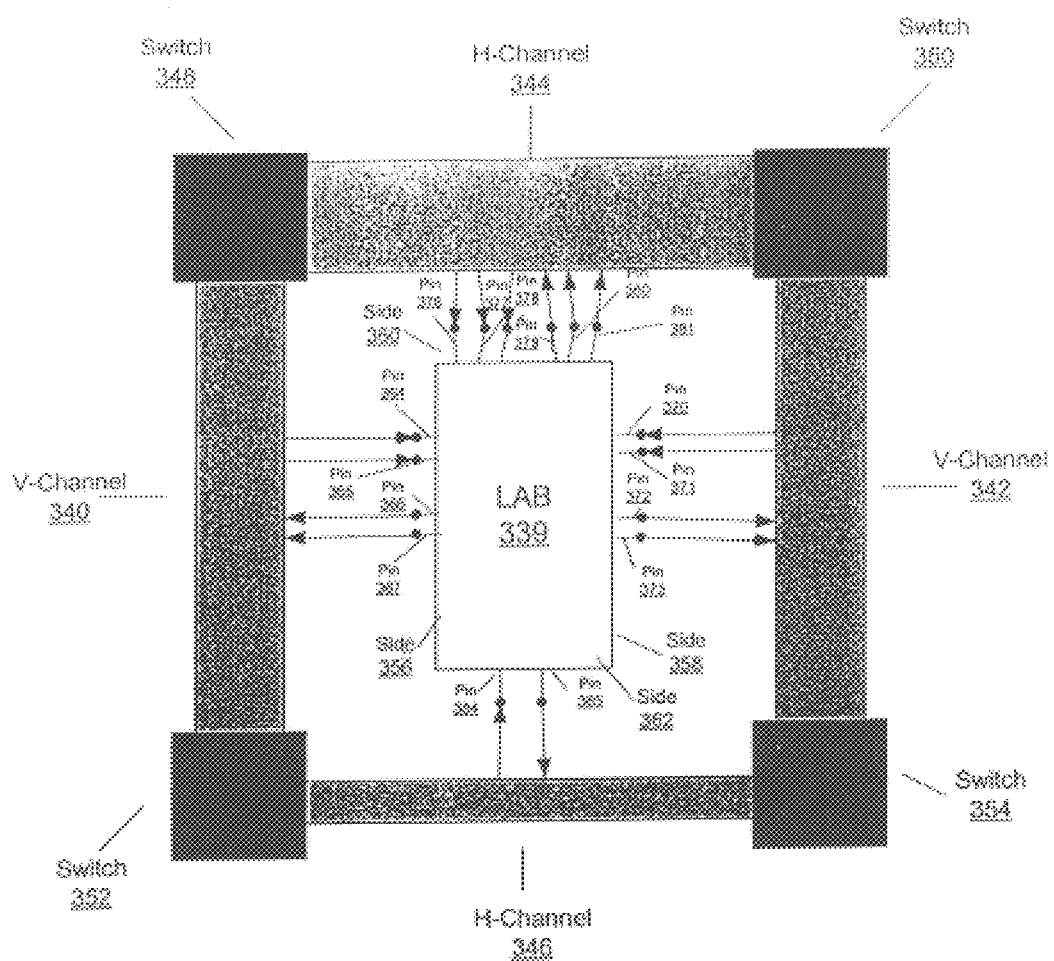
FIG. 2b shows an example of an embodiment of an asymmetrical 4-sided routing architecture according to the present invention.

FIG. 2b shows an example of an embodiment of an asymmetrical 4-sided routing architecture according to the present invention. In the asymmetrical 4-sided routing architecture, a LAB 339 can have an asymmetrical layout, e.g., a rectangular layout. In this routing architecture, the number of pins on one side of a LAB 339 differs from the number of pins on another side of the LAB 339. Also, the width of a channel disposed on one side of the LAB 339 differs from the width of another channel disposed on another side of the LAB 339. For example, the number of wires in one H-channel may be different than the number of wires in the other H-channel. Within this description of the asymmetrical 4-sided routing architecture, the number of pins on two different sides of the LAB or the number of wires within two different channels is said to differ if this difference is appreciable, such as for example, there is a ten percent difference between the number of pins on two different sides of the LAB. For example, the wires in the four channels may be allocated as follows: 40% of the wires are within one H-channel, 25% of the wires are within each of the two V-channels, and 10% of the wires are within the other H-channel. Other distributions of wires and pins is possible according to the present invention.

In FIG. 2b, a H-channel 344 is disposed on a side 360 of the LAB 339 and input pins 376, 377, 378 on the side 360 are connected to the H-channel 344. Output pins 379, 380, 381 on the side 360 are also connected to the H-Channel 344. A V-channel 340 is disposed on a side 356 of the LAB 339 and input pins 364, 365 on the side 356 are connected to the V-channel 340. Output pins 366, 367 on the side 356 are also connected to the V-channel 340. A V-channel 342 is disposed on a side 358 of the LAB 339 and input pins 370, 371 on the side 358 are connected to the V-channel 342. Output pins 372, 373 on the side 358 are also connected to the V-channel 342. A H-channel 346 is disposed on a side 362 of the LAB 339 and an input pin 384 on the side 362 is connected to the H-channel 346. An output pin 385 on the side 362 is also connected to the H-channel 346. A switch 348, a switch 350, a switch 352, and a switch 354 couple the vertical and horizontal channels together. Using the input pins and the output pins, the LAB 339 receives signals from and transmits signals to the H-channel 344, the H-channel 346, the V-channel 340, and the V-Channel 342.

Figure 3:
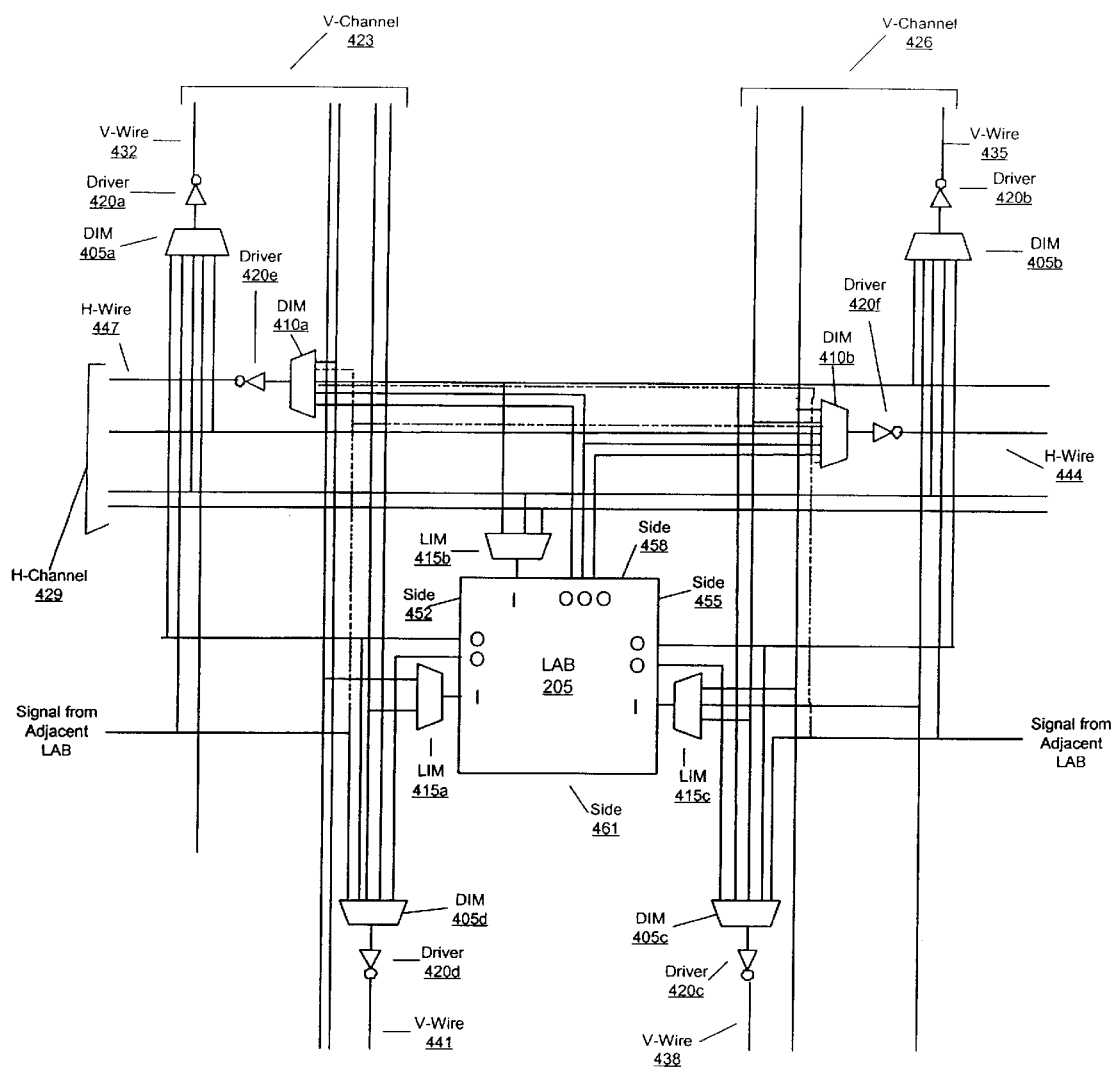
FIG. 3 shows a wire diagram of the embodiment of the 3-sided routing architecture according to the present invention.

FIG. 3 shows a wire diagram of the embodiment of the 3-sided routing architecture according to the present invention. In FIG. 3, the routing wires of a horizontal channel ("H-channel") 429 and the routing wires of a vertical channel ("V-channel") 423 and a V-channel 426 are shown. The routing wires of the H-channel 429 run in the horizontal direction and include a H-wire 447 and a H-wire 444. The routing wires of the V-channel 423 and the V-channel 426 run in the vertical direction. The V-channel 423 includes a V-wire 432 and a V-wire 441. The V-channel 426 includes a V-wire 435 and a V-wire 438. The H-channel 429 is associated with a side 458 of the LAB 205, the V-channel 423 is associated with a side 452 of the LAB 205, and the V-channel 426 is associated with a side 455 of the LAB 205. Each of the input pins of the LAB 205 is denoted by "I" and each of the output pins of the LAB 205 is denoted by "O".

The routing wires of a channel connect to an input of the LAB 205 using a multiplexer denoted a LAB input multiplexer ("LIM"). Each of the LIMs selects signals from one or more of the routing wires of the channel and outputs the signal from the selected wire into the LAB 205. In FIG. 3, a LIM 415a is associated with the V-channel 423 and the LIM 415a has as inputs two routing wires of the V-channel 423 and selects as its output a signal carried on one of these two wires. A LIM 415b is associated with the H-channel 429 and has as inputs three routing wires of the H-channel 429 and selects as its output a signal carried on one of these three wires. A LIM 415c is associated with the V-channel 426 and has as inputs three routing wires of the V-channel 426 and selects as its output a signal carried on one of these three wires.

The output of the LAB 205 is driven on a routing wire by a wire driving device. In this first configuration, the wire driving device is a multiplexer and a driver that directly drives the routing wire. In a second configuration, the wire driving device is a buffer and one or more programmable switches such as pass transistors. In a third configuration, the wire driving device is a multiplexer, a driver, and one or more programmable switches. In the first configuration, each of the routing wires has an associated driver input multiplexer ("DIM") and a driver. The DIM selects from any of the sources that can drive the wire. This includes signals from outputs of LABs, routing wires that travel in the same direction as this wire, or routing wires that are orthogonal to this wire. Since a directly driven wire selects from all the signal sources that can drive it using a single multiplexer, the switch connections and the output connections from the LABs to the routing wires are all merged into a single DIM and driver. The DIM has a set of input connections from routing wires in the same direction ("stitching connections"), routing wires in the orthogonal direction ("turning connections"), and outputs from LABs ("output connections").

The DIMs associated with a V-wire have output connections from the LABs on both sides (left and right) of that V-wire. A DIM 405a is associated with the V-channel 423 (i.e., the DIM 405a and a driver 420a drive a V-wire 432 within the V-channel 423). Inputs of the DIM 405a are coupled to an output of the LAB 205, an output from an adjacent LAB, two horizontal wires, and a vertical wire. The DIM 405a selects as its output one of these inputs and this output is driven on the V-wire 432 using the driver 420a. A DIM 405d is associated with the V-channel 423 (i.e., the DIM 405d and a driver 420d drive a V-wire 441 within the V-channel 423). Inputs of the DIM 405d are coupled to two outputs of the LAB 205, the output from the adjacent LAB, and two vertical wires of the V-channel 423. The DIM 405d selects as its output one of these inputs and this output is driven on the V-wire 441 using the driver 420d. A DIM 405b is associated with the V-channel 426 (i.e., the DIM 405b and a driver 420b drive a V-wire 435 within the V-channel 426). Inputs of the DIM 405b are coupled to an output of the LAB 205, an output from an adjacent LAB, two horizontal wires, and a vertical wire of the V-channel 426. The DIM 405b selects as its output one of these inputs and this output is driven on the V-wire 435 using the driver 4206b. A DIM 405c is associated with the V-channel 426 (i.e., the DIM 405c and a driver 420c drive a V-wire 438 within the V-channel 426). Inputs of the DIM 405c are coupled to two outputs of the LAB 205, the output from the adjacent LAB, a horizontal wire, and a vertical wire of the V-channel 426. The DIM 405c selects as its output one of these inputs and this output is driven on the V-wire 438 using the driver 420c.

A DIM 410a is associated with the H-channel 429 (i.e., the DIM 410a and a driver 420e drive a H-wire 447 within the H-channel 429). Inputs of the DIM 410a are coupled to a vertical wire of the V-channel 423, two outputs from the two different adjacent LABs, a horizontal wire, and two outputs from the LAB 205. The DIM 410a selects one of these inputs as its output and this output is driven on the H-wire 447 using the driver 420e. A DIM 410b is associated with the H-channel 429 (i.e., the DIM 410b and a driver 420f drive a H-wire 444 within the H-channel 429). Inputs of the dim 410b are coupled to two vertical wires of the V-channel 426, two outputs from the two different adjacent LABs, a horizontal wire, and two outputs of the LAB 205. The DIM 410b selects as its output one of these inputs and this output is driven on the H-wire 444 using the driver 420f. As shown here, the DIMs associated with a H-channel can have output connections from adjacent LABs. These output connections from adjacent LABs are illustrated using dotted lines. One advantage of these output connections is that they permit a LAB to drive out onto a larger set of wires, and increase the maximum number of signals that can be driven from a single LAB. The use of output connections from more than one LAB in the horizontal direction is called "mixed reach" connections. "Mixed reach" allows a LAB to access more wires without physically having more wires in the channel. The use of "mixed reach" in the vertical direction (such that more than one LAB in a given column can have an output connection to a DIM and driver) is also possible. "Mixed reach" connections are discussed in greater detail below.

In one configuration, the LAB 205 has equal number of pins on a side 452, a side 455, and a side 458. In this configuration, there are an equal number of routing wires in the channels disposed on these sides (i.e., the V-channel 423, the V-channel 426, and the H-channel 429). Also, the number of LIMs and DIMs associated with each of these three channels is equal.

In another configuration, the number of pins on one side of the LAB 205 differs from the number of pins on another side of the LAB. In this configuration, the width of a channel disposed on one of the sides 452, 455, 458 of the LAB 205 differs from the width of a channel disposed on another one of those sides. Also, the number of LIMs and DIMs associated with one of the channels 423, 426, 429 differs from the number of LIMs and DIMs associated with another one of those channels because, for example, the number of wires in the two different channels differs.

Figure 4:
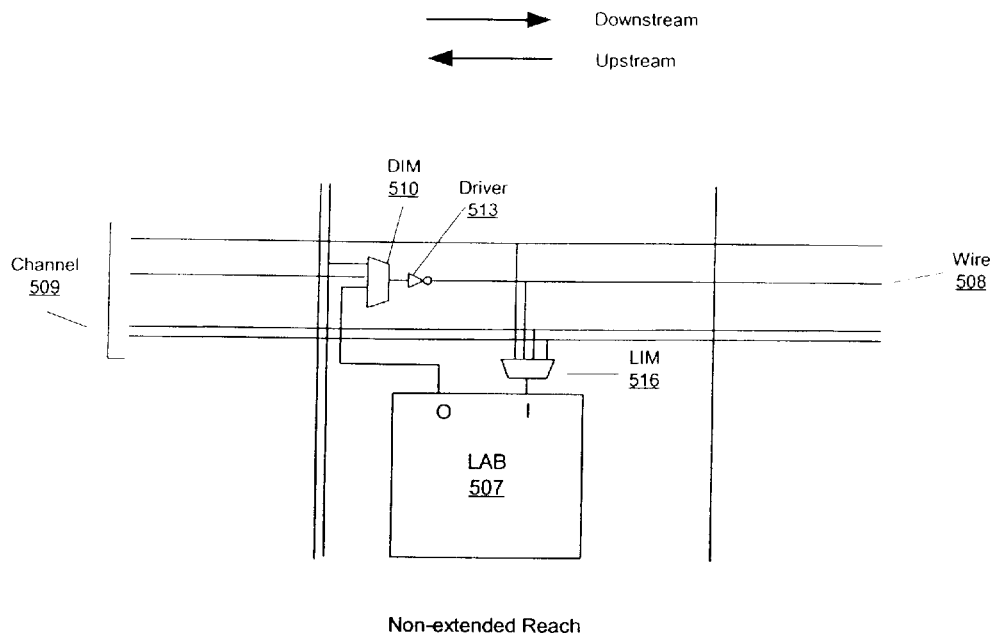
FIG. 4 shows a first embodiment for connecting a LAB to a channel according to the present invention.
Figure 5:
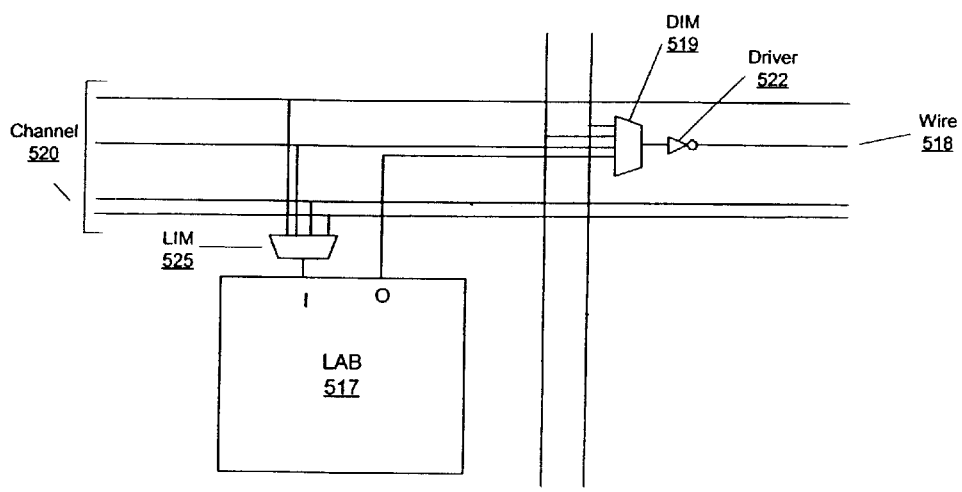
FIG. 5 shows a second embodiment for connecting a LAB to a channel according to the present invention.
Figure 7:
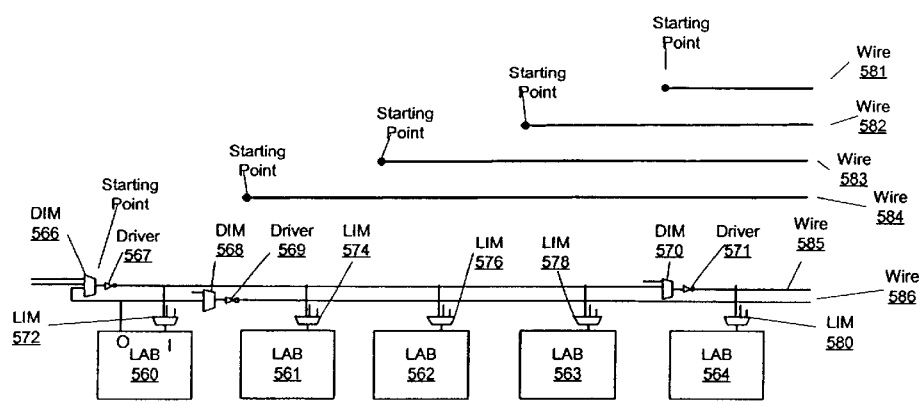
FIG. 7 shows examples of the first embodiment and the second embodiment for connecting a LAB to a channel according to the present invention.

There are variations in the relative positions of where a LAB drives a wire (the wire is driven using, for example, a DIM and a driver) and from where that LAB receives signals from wires (signals from the wires are received using, for example, a LIM) for a given LAB. FIG. 4 shows a first embodiment for connecting a LAB to a channel according to the present invention. If a LAB has a LIM that is located downstream from the DIM and driver that drives that wire, then the LAB may drive out onto a wire and also receive signals from that same wire using its LIM. This variation is called "non-extended reach" and is shown in FIG. 4. In FIG. 4, a signal flows from left to right. A first component is downstream of a second component if the first component is further in the direction of the signal flow from the second component. A first component is upstream of a second component if the first component is opposite the direction of signal flow from the second component. In FIG. 4, a LAB 507 drives a wire 508 of a channel 509 using a DIM 510 and a driver 513. The LAB 507 also receives signals from the wire 508 using a LIM 516. Here, the LIM 516 is located downstream from the DIM 510 and the driver 513 and therefore the LAB 507 can both drive the wire 508 and also-receive signals from that wire. "Non-extended reach"

allows a LAB to route its signal from its output back to its own input. A wire of length N may be connected to LABs at relative positions 0, 1, . . . N−1. FIG. 7 shows examples of the first embodiment for connecting a LAB to a channel (i.e., the "non-extended reach" connection) according to the present invention. In FIG. 7, assuming that a wire 585 has a length of four LABs, a LAB 560 can drive a signal on the wire 585 back to itself (i.e., at position 0), a LAB 561 (i.e., at position 1), a LAB 562 (i.e., at position 2), and a LAB 563 (i.e., at position N−1).

Figure 6:
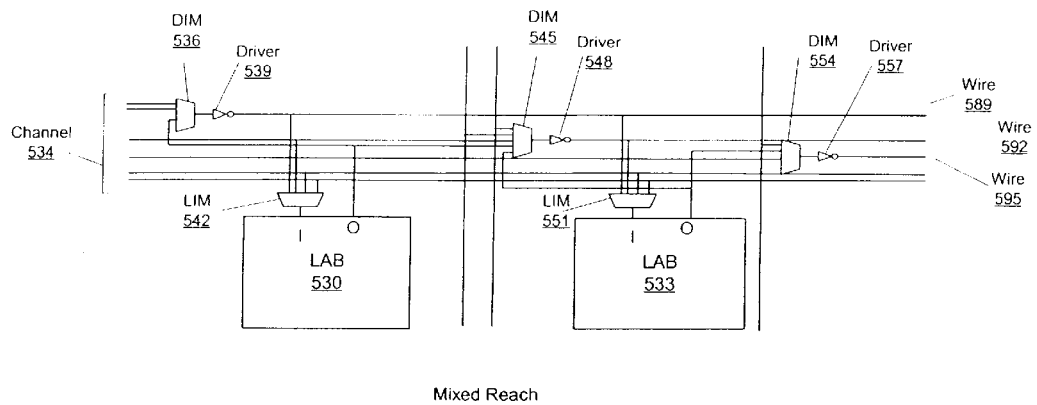
FIG. 6 shows a third embodiment for connecting a LAB to a channel according to the present invention.

FIG. 6 shows a second embodiment for connecting a LAB to a channel according to the present invention. If a LAB has a LIM that is upstream from the DIM and driver that drives a wire, then the LAB drives the wire but does not receive signals from that wire. This variation is called an "extended reach" connection and is shown in FIG. 6. In FIG. 6, a LAB 517 drives a wire 518 of a channel 520 using a DIM 519 and a driver 522. The LAB 517 receives input signals from the routing wires of the channel using a LIM 525. Here, the LIM 525 is located upstream from the DIM 519 and the driver 522 and therefore the LAB 517 can drive a signal onto the wire 518 but cannot receive the driven signal from that wire. The "extended reach" connection allows a signal to travel further on a wire than would otherwise be possible using the "non-extended reach" connection. The "extended reach" connection increases the logical distance that a signal can travel on a wire of a fixed physical length. With "extended reach", a LAB may not be able to talk to itself but it does have access to one more LAB than that provided by "non-extended reach". With "extended reach", the wire of length N can connect to LABs at relative positions 1, 2, . . . N. FIG. 7 also shows examples of the second embodiment for connecting a LAB to a channel (i.e., the "extended reach" connection) according to the present invention. In FIG. 7, assuming that the wire 586 has a length of four LABs, with "extended reach", the LAB 560 can drive a signal on the wire 586 to the LAB 561 (i.e., at position 1), the LAB 562 (i.e., at position 2), the LAB 563 (i.e., at position 3), and the LAB 564 (i.e., at position N=4).

FIG. 6 shows a third embodiment for connecting a LAB to a channel according to the present invention. A mix of "extended reach" and "non-extended reach" connections within the PLD provides a "mixed reach" connection. With the "non-extended reach" and the "extended reach" connections, the DIM associated with one LAB is close to an adjacent LAB allowing both LABs to output signals to that DIM (e.g., a short wire segment from each of the two LABs can reach the wire driving device). In this case, one LAB would use that DIM for "extended reach" and the other LAB would use that DIM for "non-extended reach". Thus the single wire driven by that DIM may provide both "extended reach" and "non-extended reach" connections called "mixed reach" connections. FIG. 6 shows "mixed reach" connections. In FIG. 6, a channel 534 includes a wire 589, a wire 592, and a wire 595. A LAB 530 drives the wire 589 using a DIM 536 and a driver 539. The LAB 530 also drives the wire 592 using a DIM 545 and a driver 548. The LAB 530 receives signals from several routing wires, including the wire 589, using a LIM 542. A LAB 533 drives the wire 595 using a DIM 554 and a driver 557. The LAB 533 also drives the wire 592 using the DIM 545 and the driver 548. The LAB 533 receives signals from several routing wires, including the wire 592, using a LIM 551. In FIG. 6, the DIM 545 provides a "mixed reach" connection since it provides an "extended reach" connection to the LAB 530 and a "non-extended reach" connection to the LAB 533.

If a LAB has a complete set of internal connections that allow its outputs to be connected back to its inputs without the use of the channels outside the LAB, then the "extended reach" connection may be preferable to the "non-extended reach" connection or the "mixed reach" connection. If these internal connections do not exist in the LAB, then the "mixed reach" connection may be preferable as it provides the ability to feed an output from a LAB directly back into the same LAB on one routing wire. In general, the "mixed reach" connection may be preferable to the others since it increases the number of wires that can be driven by a single LAB thus reducing peak wire demand in routing intensive areas. For example, with the "mixed reach" connection as shown in FIG. 6, the single LAB 530 can drive both the wire 589 and the wire 592. With "non-extended reach" and "extended reach", however, only one wire is driven (i.e., wire 508 and wire 518 respectively). In this embodiment, the "mixed reach" allows a LAB to drive twice as many wires compared to when using either the "non-extended reach" connection or the "extended reach" connection. The "mixed reach" connection spreads the outputs of a LAB across twice as many wires than either the "extended reach" or the "non-extended reach" connections in isolation, increasing the routability of the PLD by spreading out local concentrations of signals.

In FIG. 7, the length of each of the wires 581, 582, 583, 584, 585, and 586 is assumed to be four LABs. These wires are staggered such that the starting points of each wire are spread uniformly along the length of the channel to which these wires belong. For example, in FIG. 7, using staggered wires of length four LABs, the distance between the starting points of wire 581 and wire 585 are four LABs away. Each of the wires 581, 582, 583, 584, 585, and 586 have starting points that are uniformly one LAB away, e.g., the starting point for wire 581 is one LAB length away from the starting point of wire 582, the starting point for wire 582 is one LAB length away from the starting point for wire 583, and the starting point for wire 583 is one LAB length away from the starting point for wire 584.

In FIG. 7, using "non-extended reach", the LAB 560 can drive the wire 585 using a DIM 566 and a driver 567 enabling it to connect to itself (using a LIM 572), the LAB 561 (using a LIM 574), the LAB 562 (using a LIM 576), and the LAB 563 (using a LIM 578). Using "extended reach", the LAB 560 can drive the wire 586 enabling it to connect to the LAB 561 (using the LIM 574), the LAB 562 (using the LIM 576), the LAB 563 (using the LIM 578), and the LAB 564 (using the LIM 580). With "extended reach", the LAB 560 can connect to one extra LAB (i.e., the LAB 564) than when using "non-extended reach".

Figure 8:
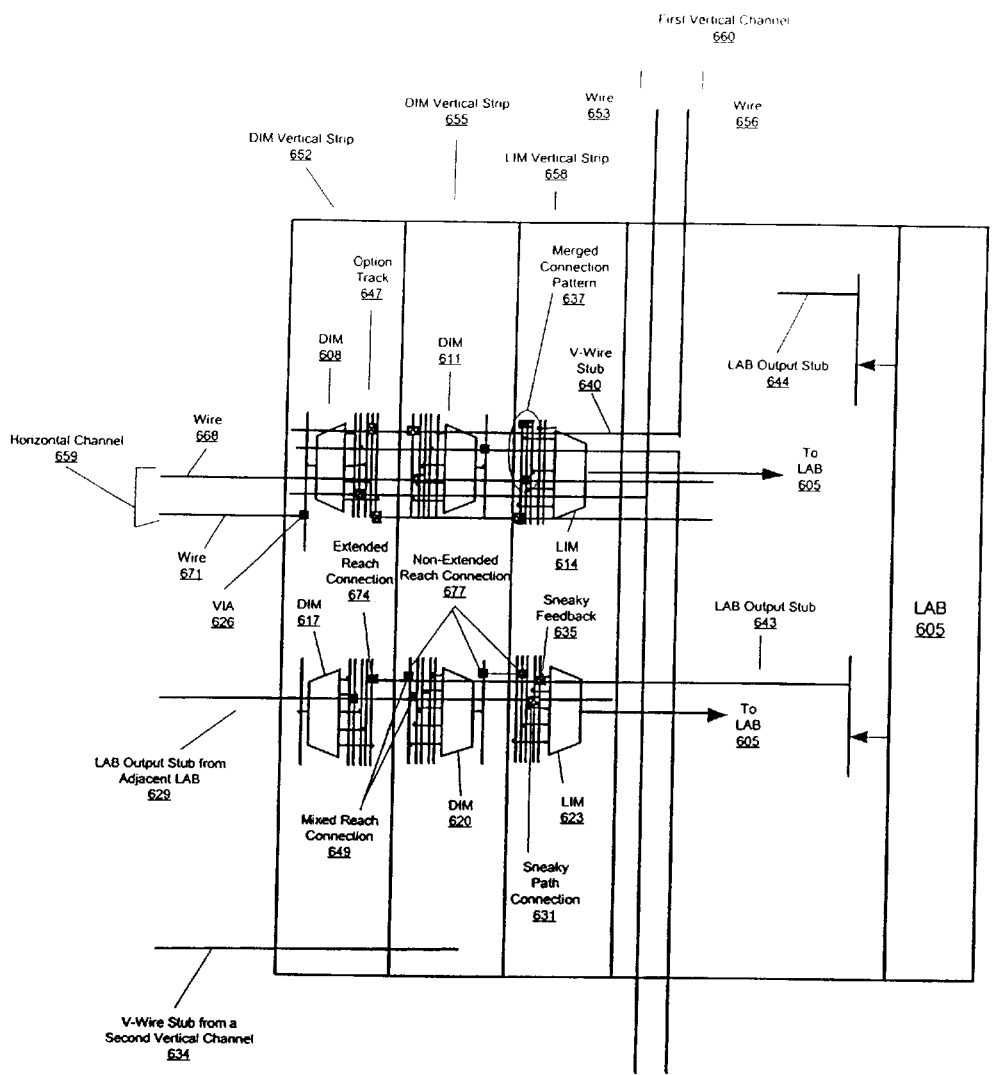
FIG. 8 shows a second embodiment of the PLD in a stubbing layout according to the present invention.

FIG. 8 shows another embodiment of a PLD in a stubbing layout according to the present invention. In FIG. 8, a PLD 600 includes a LAB and routing structures (e.g., LIMs and wire driving devices such as DIMs and drivers). A LAB 605 has one or more regions of routing structures located, for example, on either or both sides of the LAB 605. The routing structures within a region are oriented in a particular direction. For example, the routing structures may be oriented in the horizontal or vertical directions. As shown in FIG. 8, in one configuration, each region is organized as a vertical strip of LIMs or wire driving devices (i.e., DIMs and drivers) that are oriented in the vertical direction. A DIM vertical strip 652 includes a DIM 608 and its corresponding driver (not shown) and a DIM 617 and its corresponding driver (not shown). Here, the DIM 608 and the DIM 617 drive their outputs to the left away from the LAB 605. A DIM vertical strip 655 includes a DIM 611 and its corresponding driver (not shown) and a DIM 620 and its corresponding driver (not shown). In this strip, the DIM 611 and the DIM 620 drive their outputs to the right towards the LAB 605. A LIM vertical strip 658 includes a LIM 614 and a LIM 623. Each of the vertical strips may be dedicated to a single type or direction of routing wire, or may be used for more than one type or direction of routing wire. Each of the LIMs and DIMs in the vertical strips includes a number of vertical wires called "option tracks". Each of the inputs of the DIM and the output of the driver have an option track and each of the inputs of the LIM has an option track. The option track allows a LAB output stub, a V-wire stub, or a horizontal wire to connect to inputs of a DIM or LIM, or an output of the driver corresponding to that DIM. These connections between the stubs or wires and the routing structures are made, for example, using vial which are placed at the time the PLD is laid out and designed. In FIG. 8, an option track 647 is used to connect an input of the DIM 608 to a V-wire stub 640.

FIG. 8 also shows an example of the two channels oriented in the first direction and the one channel oriented in the second direction to which the LAB 605 may connect. In this example, two vertical channels and one horizontal channel are used. A first vertical channel 660 includes a wire 653 and a wire 656. A horizontal channel 659 includes a wire 668 and a wire 671. A V-wire stub from a second vertical channel 634 is also shown.

The stubbing layout shown in FIG. 8 uses stubs to make connections between the wires of one channel and the routing structures. The stub is a short wire segment that allows connections to be made to the wire segment running in a first direction even though the wire itself within the channel runs in a different direction. In other words, the stubs allow connections to routing structures to be made to wires running in the same direction even though the wires itself may run in different directions. For example, a horizontal stub attached to a vertical wire of a vertical channel allow connections to the vertical wire to be made to a horizontal wire (i.e., the horizontal stub) running in the horizontal direction. In this case, the horizontal stub allows connections to the vertical wire and connections to the horizontal wires of a horizontal channel to be made to wires running in the horizontal direction. The design of PLDs is made easier by having the wires to which connections are made run in the same direction.

In the configuration shown in FIG. 8, horizontal wire stubs are used with the vertical wires such that all the connections to the wires are made to wires running in the horizontal direction. In another configuration, vertical wire stubs can be used such that all the connections to the wires are made to wires running in the vertical direction. In FIG. 8, the wires of a vertical channel that are to be connected to the input or output of the DIMs and drivers or the LIMs have a stub running in the horizontal direction ("horizontal stub") that can be via programmably connected to the option track corresponding to the inputs or the output of the DIMs and drivers or the LIMs. This horizontal stub may occur anywhere along the length of the vertical wire of the vertical channel and is called a V-wire stub. A V-wire stub 640, for example, connects the wire 656 to an input of the LIM 614. A LAB output stub 643 and a LAB output stub 644 connect the LAB 605's output to DIMs or LIMs using the appropriate option track. Each of the LAB output stubs 643 and 644 runs vertically for some distance and then includes one or more horizontal stubs to make connections to the DIMs or LIMs.

When the PLD is laid out and designed, a via can be programmably placed at the intersection of any wire and one of the input or output option tracks to define the exact routing patterns that can be configured. In FIG. 8, a via 626 connects a wire 671 to the output of the DIM 608.

A sneaky feedback 635 is a direct connection between the LAB output stub 643 (i.e., the output of the LAB 605) and that LAB's input multiplexer, the LIM 623. The sneaky feedback 635 is used to loopback the output of the LAB 605 directly back to itself. In FIG. 8, a non-extended reach connection 677 is shown. The non-extended reach connection 677 includes connecting the LAB output stub 643 to an option track of one of the inputs of the DIM 620. In addition, the output of the DIM 620 is connected to an option track of one of the inputs of the LIM 623. An extended reach connection 674 is also shown. The extended reach connection 674 includes connecting the LAB output stub 643 to an option track of one of the inputs of the DIM 617. The DIM 617 drives its output away from the LAB 605 and the LAB 605 cannot directly connect to the wire driven by the DIM 617. A mixed reach connection 649 includes connecting an option track of one of the input of the DIM 620 to the output of the LAB 605 (i.e., the output signal carried on the LAB output stub 643) and also connecting another one of the inputs of the DIM 620 to the output of an adjacent LAB (i.e., the output signal carried on the LAB output stub from adjacent LAB 629). In this case, the DIM 620 provides "non-extended reach" to the LAB 605 and "extended reach" to the adjacent LAB.

Typically, each input and output on the LAB is connected exclusively to wires in one channel (e.g., the H-channel or the V-channel). In this embodiment, it is also possible to connect any of the input and output pins to wires in more than one channel. The connection of an input: or output pin of the LAB to two or more channels is referred to as a "merged connection pattern". The "merged connection pattern" allows an input pin or an output pin of a LAB to reach, for example, both the H-channel and the V-channel thus increasing routing flexibility. In FIG. 8, a merged connection pattern 637 connects, using vias, a V-wire stub 640 from the wire 656 of the first vertical channel 660 and the wire 668 of the horizontal channel 659 with the option tracks corresponding to two different inputs of the LIM 614 and the output of the LIM 614 is connected to an input pin of the LAB 605. The mixture of wires from two or more different channels that connect to an input pin or an output pin of the LAB varies. The actual connections using wires from the horizontal channel and wires from the vertical channel are based upon factors such as the relative number of wires in each channel or the expected relative positions of other types of logic blocks. For example, a column of random access memory ("RAM") blocks in a PLD uses predominantly horizontal connections for data signals (so they can reach the LABs) and predominantly vertical connections for address wires (so multiple RAMs can be connected with common address signals). In this case, the mixture of connections to wires of the horizontal channel and wires of the vertical channel could be adjusted preferentially based on the type of pins on the RAM block.

In another configuration, the one or more regions are one or more horizontal strips of either LIMs or wire driving devices (e.g., DIMs and drivers). In each of these horizontal strips, each of the LIMs are arranged in the horizontal direction and each of the wire driving devices are arranged in the horizontal direction. In this configuration, the option tracks are oriented in the horizontal direction and the wires of the horizontal channel have stubs that are short pieces of wire oriented in the vertical direction.

Figure 9:
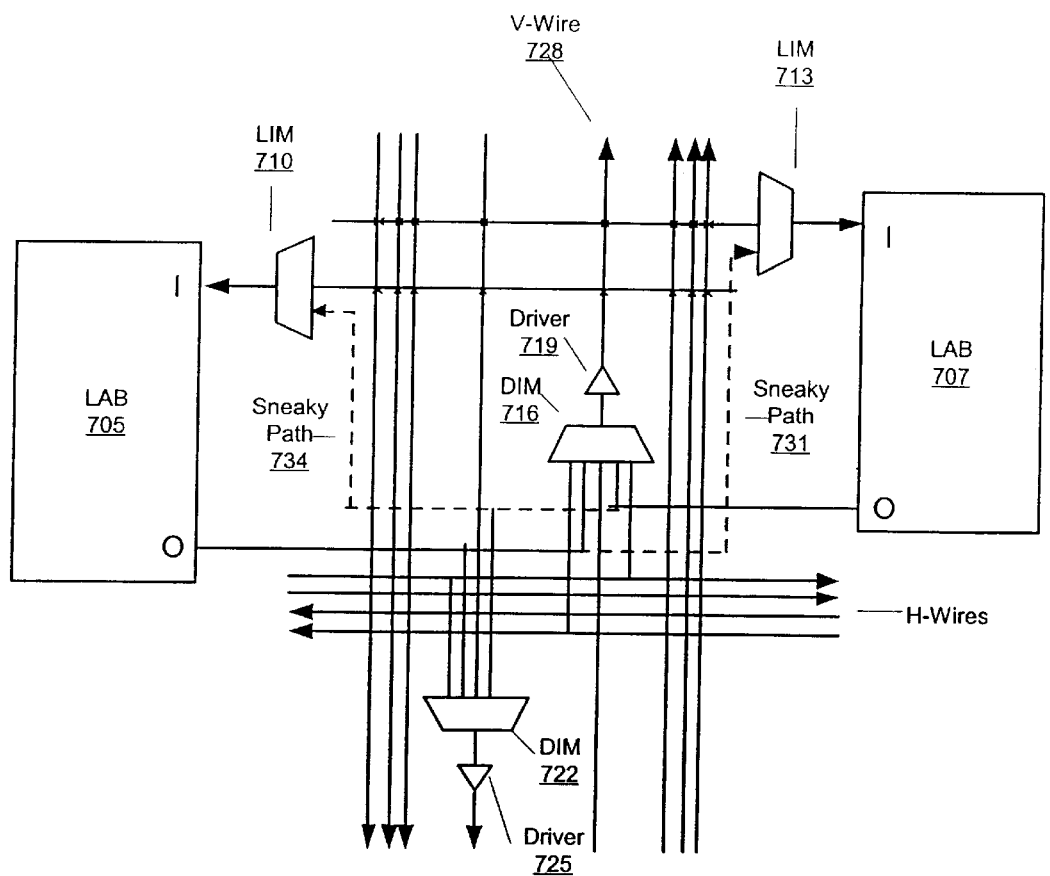
FIG. 9 shows an embodiment of a sneaky path according to the present invention.

FIG. 9 shows an embodiment of a sneaky path according to the present invention. The output pin from each LAB connects to the inputs of a number of DIMs. Since the DIMs are typically located physically close to the LIM corresponding to a particular LAB, the output pin of the particular LAB can be directly connected to an input pin of an adjacent LAB (the connection to the input pin of the adjacent LAB is by way of the adjacent LAB's corresponding LIM). This direct connection will be faster than driving from the output pin of the particular LAB, then going through a DIM, then onto a routing wire, and then back into the LIM corresponding to the adjacent LAB because the direct connection avoids the delays associated with going through the DIM and the routing wire. This direct connection is referred to as a "sneaky path". In FIG. 9, a LAB 705 drives its output onto a V-wire 728 using a DIM 716 and a corresponding driver 719. This output can be input into an adjacent LAB 707 by way of a LIM 713 using a sneaky path 731. The sneaky path 731 provides a direct connection between the output of the LAB 705 and the input of the adjacent LAB 707. The sneaky path 731 provides a faster connection between the LAB 705 and the adjacent LAB 707 since the delays associated with travelling through the DIM 716 and being driven on the V-wire 728 are avoided. Similarly, the LAB 707 drives its output onto the V-wire 728 using the DIM 716 and the driver 719. This output can be input into the adjacent LAB 705 by way of the LIM 710 that connects to the V-wire 728. A sneaky path 734 provides a faster direct connection between the output of the LAB 707 and the input of the adjacent LAB 705 by way of the LIM 710.

FIG. 8 shows a "sneaky path" in a stubbing layout. In FIG. 8, a sneaky path connection 631 connects the output of an adjacent LAB, using the LAB output stub from adjacent LAB 629, to the input of the LAB 605 by connecting to one of the inputs of the LIM 623.

Figure 10:
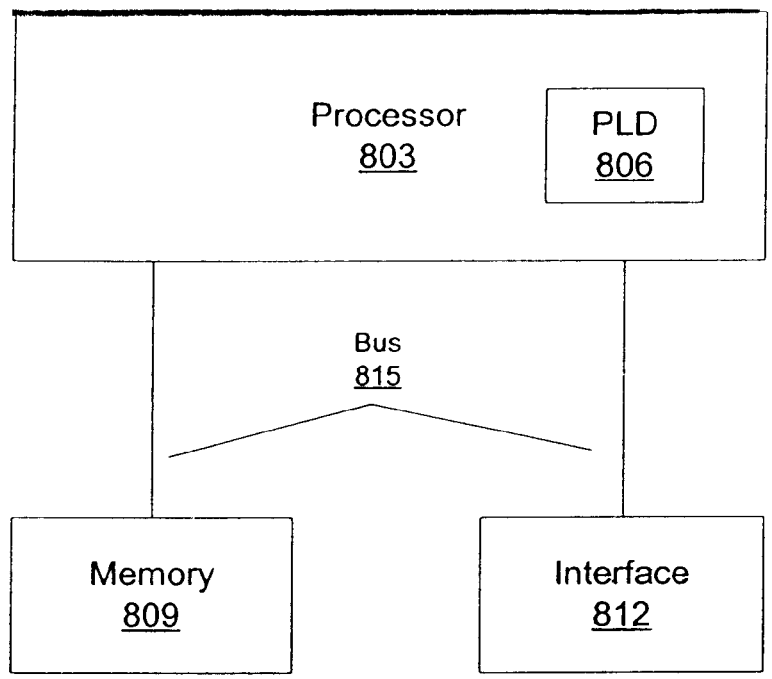
FIG. 10 shows an electronic system that includes a PLD according to an embodiment of the present invention.

The PLDs according to the present invention may be included in a processor that is part of an electronic system. The electronic system may be a digital computing system such as a general or special purpose computer, or a specialized digital switching network, or other processing system. FIG. 10 shows an electronic system 801 that includes a PLD 806 according to an embodiment of the present invention. In FIG. 10, a processor 803 is coupled to a memory 809 and an interface 812 using a bus 815. The processor 803 may be used to configure the PLD 806. The PLD 806 may serve different purposes within the processor 803. For example, the PLD 806 may be a logical building block of the processor 803 supporting its internal and external operations.

The memory 809 stores information such as source code. This source code may be compiled into machine language and executed by the processor 803. The memory 809 may also store configuration data for programming the PLD 806. The interface 812 provides data to the processor 803 or receives data from the processor 803. For example, a user may input, using the interface 812, logical functions to be programmed into the PLD 806. The bus 815 transfers data between the processor 803, the memory 809, and the interface 812.

While the present invention has been particularly described with respect to the illustrated embodiments, it will be appreciated that various alterations, modifications and adaptations may be based on the present disclosure, and are intended to be within the scope of the present invention. While the invention has been described in connection with what are presently considered to be the most practical and preferred embodiments, it is to be understood that the present invention is not limited to the disclosed embodiment but, on the contrary, is intended to cover various modifications and equivalent arrangements included within the scope of the claims.

What is claimed is:

1. An integrated circuit, comprising:
    a first function block having a plurality of inputs and a plurality of outputs;
    a first channel coupled to a first portion of the plurality of inputs located on a first side of the first function block and coupled to a first portion of the plurality of outputs located on the first side of the first function block;
    a second channel coupled to a second portion of the plurality of inputs located on a second side of the first function block, the second side opposite the first side, and coupled to a second portion of the plurality of outputs located on the second side of the first function block;
    a third channel coupled to the first channel and the second channel and coupled to a third portion of the plurality of inputs located on a third side of the first function block and coupled to a third portion of the plurality of outputs located on the third side of the first function block; and
    a fourth channel associated with a fourth side of the function block that is opposite the third side, the fourth channel coupled only to the first channel and the second channel,
    wherein there is at least one of: (a) a difference between any two of a number of inputs of the first, second, or third portion of the plurality of inputs, (b) a difference between any two of a number of outputs of the first, second, or third portion of the plurality of outputs, and (c) a difference between any two of the number of inputs combined with the number of outputs of the first, second, or, third portion of the plurality of inputs and outputs.

2. The integrated circuit of claim 1 wherein there is a difference between any two off: (a) a number of a first plurality of wires within the first channel, (b) a number of a second plurality of wires within the second channel, or (c) a number of a third plurality of wires within the third channel.

3. The integrated circuit of claim 1 further comprising
    a wire driving device having a plurality of inputs and an output, a particular one of the plurality of inputs coupled to a particular one of the plurality of outputs on a particular function block side that is any one of the first side, the second side, or the third side of the first function block, the wire driving device driving a signal, output by the first function block, on a particular one of a first plurality of wires within the first channel, a second plurality of wires within the second channel, or a third plurality of wires within the third channel that is associated with the particular function block side; and
    an input multiplexer having a plurality of inputs and an output, a particular one of the plurality of inputs coupled to the particular one of the first plurality of wires within the first channel, the second plurality of wires within the second channel, or the third plurality of wires within the third channel that is associated with the particular function block side,
    wherein the wire driving device is upstream from the input multiplexer.

4. The integrated circuit of claim 3 wherein the wire driving device drives the signal to at least one of the particular one of the plurality of inputs of the input multiplexer, and up to a length of the particular one of the first plurality of wires, the second plurality of wires, or the third plurality of wires minus a length of the first function block away.

5. The integrated circuit of claim 1 further comprising
an input multiplexer having a plurality of inputs and an output, the output coupled to a particular one of the plurality of inputs on a particular function block side that is any one of the first side, the second side, or the third side of the first function block; and
a wire driving device having a plurality of inputs and an output, a particular one of the plurality of inputs coupled to a particular one of the plurality of outputs on the particular function block side, the output of the wire driving device driving a particular one of a first plurality of wires within the first channel, a second plurality of wires within the second channel, or a third plurality of wires within the third channel that is associated with the particular function block side,
wherein the input multiplexer is upstream from the wire driving device.

6. The integrated circuit of claim 5 wherein the wire driving device drives a signal up to the length of the particular one of the first plurality of wires, the second plurality of wires, or the third plurality of wires away.

7. The integrated circuit of claim 1 further comprising
a second function block having a plurality of inputs and a plurality of outputs;
an input multiplexer having a plurality of inputs and an output, the output coupled to a particular one of the plurality of inputs of the first function block; and
a wire driving device having a plurality of inputs and an output, a first one of the plurality of inputs of the wire driving device coupled to a particular one of the plurality of outputs of the first function block, and a second one of the plurality of inputs of the wire driving device coupled to a particular one of the plurality of outputs of the second function block, and the output of the wire driving device coupled to a particular one of the plurality of inputs of the input multiplexer,
wherein the wire driving device is downstream from the second function block and the wire driving device is upstream from the input multiplexer and the first function block.

8. The integrated circuit of claim 7 wherein the output of the wire driving device is coupled to a particular one of a first plurality of wires within the first channel, a second plurality of wires within the second channel, or a third plurality of wires within the third channel that is associated with the wire driving device.

9. The integrated circuit of claim 8 wherein the wire driving device drives a first signal from the second function block up to the length of the particular one of the first plurality of wires, the second plurality of wires, or the third plurality of wires away, or the wire driving device drives a second signal from the first function block to at least one of: (a) the particular one of the plurality of inputs of the input multiplexer, and (b) up to the length of the particular one of the first plurality of wires, the second plurality of wires, or the third plurality of wires minus the length of the first function block away.

10. The integrated circuit of claim 1 wherein a particular one of the plurality of inputs or a particular one of the plurality of outputs of the first function block is coupled to at least two of the first channel, the second channel, or the third channel.

11. The integrated circuit of claim 10 wherein the coupling to the third channel is coupling to a particular one of a third plurality of wires within the third channel, the coupling to the first channel is coupling to a particular one of a first plurality of wires within the first channel, and the coupling to the second channel is coupling to a particular one of a second plurality of wires within the second channel.

12. The integrated circuit of claim 1 wherein a particular one of the plurality of outputs of the first function block is directly coupled to a particular one of a plurality of inputs of a second function block.

13. The integrated circuit of claim 12 wherein an input multiplexer, coupled to the second function block and having a plurality of inputs and an output, a particular one of the plurality of inputs coupled to the particular one of the plurality of outputs of the first function block and the output of the input multiplexer coupled to the particular one of the plurality of inputs of the second function block.

14. The integrated circuit of claim 1 wherein the integrated circuit is a programmable logic device.

15. The integrated circuit of claim 1 wherein the first function blocks is a logic array block, a memory block, an input/output block, or a multiply-accumulate block.

16. A digital system including the integrated circuit of claim 1.

17. An electronic system, comprising:
a processor that includes a programmable logic device as in claim 1;
a memory to store information;
an interface; and
a bus to couple together the processor, the memory, and the interface.

18. The electronic system of claim 17 wherein the processor configures the programmable logic device.

19. An integrated circuit, comprising:
a first function block having a plurality of inputs and a plurality of outputs;
a first channel coupled to a first portion of the plurality of inputs located on a first side of the first function block and coupled to a first portion of the plurality of outputs located on the first side of the first function block;
a second channel coupled to a second portion of the plurality of inputs located on a second side of the first function block, the second side opposite the first side, and coupled to a second portion of the plurality of outputs located on the second side of the first function block;
a third channel coupled to the first channel and the second channel and coupled to a third portion of the plurality of inputs located on a third side of the first function block and coupled to a third portion of the plurality of outputs located on the third side of the first function block;
a fourth channel associated with a fourth side of the function block that is opposite the third side, the fourth channel coupled only to the first channel and the second channel;
an input multiplexer having a plurality of inputs and an output, the output coupled to a particular one of the plurality of inputs on a particular function block side that is any one of the first side, the second side, or the third side of the first function block; and
a wire driving device having a plurality of inputs and an output, a particular one of the plurality of inputs coupled to a particular one of the plurality of outputs on the particular function block side, the output of the wire driving device driving a particular one of a first plurality of wires within the first channel, a second plurality of wires within the second channel, or a third plurality of wires within the third channel that is associated with the particular function block side, wherein the input multiplexer is upstream from the wire driving device.

20. The integrated circuit of claim 19 wherein there is a difference between any two, of: (a) a number of a first plurality of wires within the first channel, (b) a number of a second plurality of wires within the second channel, or (c) a number of a third plurality of wires within the third channel.

21. The integrated circuit of claim 19 wherein a particular one of the plurality of inputs or a particular one of the plurality of outputs of the first function block is coupled to at least two of the first channel, the second channel, or the third channel.

22. The integrated circuit of claim 19 wherein the coupling to the third channel is coupling to another one of the third plurality of wires within the third channel, the coupling to the first channel is coupling to another one of a first plurality of wires within the first channel, and the coupling to the second channel is coupling to another one of a second plurality of wires within the second channel.

23. The integrated circuit of claim 19 wherein a particular one of the plurality of outputs of the first function block is directly coupled to a particular one of a plurality of inputs of a second function block.

24. The integrated circuit of claim 23 wherein another input multiplexer, coupled to the second function block and having a plurality of inputs and an output, a particular one of the plurality of inputs coupled to the particular one of the plurality of outputs of the first function block and the output of the other input multiplexer coupled to the particular one of the plurality of inputs of the second function block.

25. The integrated circuit of claim 19 wherein the integrated circuit is a programmable logic device.

26. The integrated circuit of claim 19 wherein the first function blocks is a logic array block, a memory block, an input/output block, or a multiply-accumulate block.

27. A digital system including the integrated circuit of claim 19.

28. The integrated circuit of claim 19 wherein the wire driving device drives a signal up to the length of the particular one of the first plurality of wires, the second plurality of wires, or the third plurality of wires away.

29. The integrated circuit of claim 19 wherein there is at least one of: (a) a difference between any two of a number of inputs of the first, second, or third portion of the plurality of inputs, (b) a difference between any two of a number of outputs of the first, second, or third portion of the plurality of outputs, and (c) a difference between any two of the number of inputs combined with the number of outputs of the first, second, or third portion of the plurality of inputs and outputs.

30. An integrated circuit, comprising:

a first function block having a plurality of inputs and a plurality of outputs;

a first channel coupled to a first portion of the plurality of inputs located on a first side of the first function block and coupled to a first portion of the plurality of outputs located on the first side of the first function block;

a second channel coupled to a second portion of the plurality of inputs located on a second side of the first function block, the second side opposite the first side, and coupled to a second portion of the plurality of outputs located on the second side of the first function block;

a third channel coupled to the first channel and the second channel and coupled to a third portion of the plurality of inputs located on a third side of the first function block and coupled to a third portion of the plurality of outputs located on the third side of the first function block;

a fourth channel associated with a fourth side of the function block that is opposite the third side, the fourth channel coupled only to the first channel and the second channel;

a second function block having a plurality of inputs and a plurality of outputs;

an input multiplexer having a plurality of inputs and an output, the output coupled to a particular one of the plurality of inputs of the first function block; and a wire driving device having a plurality of inputs and an output, a first one of the plurality of inputs of the wire driving device coupled to a particular one of the plurality of outputs of the first function block, and a second one of the plurality of inputs of the wire driving device coupled to a particular one of the plurality of outputs of the second function block, and the output of the wire driving device coupled to a particular one of the plurality of inputs of the input multiplexer, wherein the wire driving device is downstream from the second function block and the wire driving device is upstream from the input multiplexer and the first function block.

31. The integrated circuit of claim 30 wherein there is at least one of: (a) a difference between any two of a number of inputs of the first, second, or third portion of the plurality of inputs, (b) a difference between any two of a number of outputs of the first, second, or third portion of the plurality of outputs, and (c) a difference between any two of the number of inputs combined with the number of outputs of the first, second, or third portion of the plurality of inputs and outputs.

32. The integrated circuit of claim 30 wherein there is a difference between any two Of: (a) a number of a first plurality of wires within the first channel, (b) a number of a second plurality of wires within the second channel, or (c) a number of a third plurality of wires within the third channel.

33. The integrated circuit of claim 30 wherein a particular one of the plurality of inputs or a particular one of the plurality of outputs of the first function block is coupled to at least two of the first channel, the second channel, or the third channel.

34. The integrated circuit of claim 33 wherein the coupling to the third channel is coupling to a particular one of a third plurality of wires within the third channel, the coupling to the first channel is coupling to a particular one of a first plurality of wires within the first channel, and the coupling to the second channel is coupling to a particular one of a second plurality of wires within the second channel.

35. The integrated circuit of claim 30 wherein a particular one of the plurality of outputs of the first function block is directly coupled to a particular one of a plurality of inputs of a second function block.

36. The integrated circuit of claim 35 wherein another input multiplexer, coupled to the second function block and having a plurality of inputs and an output, a particular one of the plurality of inputs coupled to the particular one of the plurality of outputs of the first function block and the output of the other input multiplexer coupled to the particular one of the plurality of inputs of the second function block.

37. The integrated circuit of claim 30 wherein the integrated circuit is a programmable logic device.

38. The integrated circuit of claim 30 wherein the first function blocks is a logic array block, a memory block, an input/output block, or a multiply-accumulate block.

39. A digital system including the integrated circuit of claim 30.

40. The integrated circuit of claim 30 wherein the output of the wire driving device is coupled to a particular one of a first plurality of wires within the first channel, a second plurality of wires within the second channel, or a third plurality of wires within the third channel that is associated with the wire driving device.

41. The integrated circuit of claim 40 wherein the wire driving device drives a first signal from the second function block up to the length of the particular one of the first plurality of wires, the second plurality of wires, or the third plurality of wires away, or the wire driving device drives a second signal from the first function block to at least one of: (a) the particular one of the plurality of inputs of the input multiplexer, and (b) up to the length of the particular one of the first plurality of wires, the second plurality of wires, or the third plurality of wires minus the length of the first function block away.

42. The integrated circuit of claim 38 wherein a particular one of the plurality of outputs of the first function block is directly coupled to a particular one of a plurality of inputs of a second function block.

43. The integrated circuit of claim 38 wherein the integrated circuit is a programmable logic device.

44. The integrated circuit of claim 38 wherein the first function blocks is a logic array block, a memory block, an input/output block, or a multiply-accumulate block.

45. An integrated circuit, comprising:
a first function block having a plurality of inputs and a plurality of outputs;
a first channel coupled to a first portion of the plurality of inputs located on a first side of the first function block and coupled to a first portion of the plurality of outputs located on the first side of the first function block;
a second channel coupled to a second portion of the plurality of inputs located on a second side of the first function block, the second side opposite the first side, and coupled to a second portion of the plurality of outputs located on the second side of the first function block;
a third channel coupled to the first channel and the second channel and coupled to a third portion of the plurality of inputs located on a third side of the first function block and coupled to a third portion of the plurality of outputs located on the third side of the first function block;
a fourth channel located on a fourth side of the function block that is opposite the third side, the fourth channel coupled only to the first channel and the second channel;
a wire driving device having a plurality of inputs and an output, a particular one of the plurality of inputs coupled to a particular one of the plurality of outputs on a particular function block side that is any one of the first side, the second side, or the third side of the first function block, the wire driving device driving a signal, output by the first function block, on a particular one of a first plurality of wires within the first channel, a second plurality of wires within the second channel, or a third plurality of wires within the third channel that is associated with the particular function block side; and
an input multiplexer having a plurality of inputs and an output, a particular one of the plurality of inputs coupled to the particular one of the first plurality of wires within the first channel, the second plurality of wires within the second channel, or the third plurality of wires within the third channel that is associated with the particular function block side,
wherein the wire driving device is upstream from the input multiplexer.

46. The integrated circuit of claim 45 wherein the wire driving device drives the signal to at least one of the particular one of the plurality of inputs of the input multiplexer, and up to a length of the particular one of the first plurality of wires, the second plurality of wires, or the third plurality of wires minus a length of the first function block away.

47. The integrated circuit of claim 45 wherein there is at least one of: (a) a difference between any two of a number of inputs of the first, second, or third portion of the plurality of inputs, (b) a difference between any two of a number of outputs of the first, second, or third portion of the plurality of outputs, and (c) a difference between any two of the number of inputs combined with the number of outputs of the first, second, or third portion of the plurality of inputs and outputs.

48. The integrated circuit of claim 45 wherein there is a difference between any two of: (a) a number of the first plurality of wires within the first channel, (b) a number of the second plurality of wires within the second channel, or (c) a number of the third plurality of wires within the third channel.

49. The integrated circuit of claim 45 wherein a particular one of the plurality of inputs or a particular one of the plurality of outputs of the first function block is coupled to at least two of the first channel, the second channel, or the third channel.

50. A digital system including the integrated circuit of claim 45.

51. The integrated circuit of claim 49 wherein the coupling to the third channel is coupling to another one of the third plurality of wires within the third channel, the coupling to the first channel is coupling to another one of the first plurality of wires within the first channel, and the coupling to the second channel is coupling to another one of the second plurality of wires within the second channel.

52. The integrated circuit of claim 49 wherein another input multiplexer, coupled to the second function block and having a plurality of inputs and an output, a particular one of the plurality of inputs coupled to the particular one of the plurality of outputs of the first function block and the output of the other input multiplexer coupled to the particular one of the plurality of inputs of the second function block.

53. An integrated circuit, comprising:
a function block having a plurality of inputs and a plurality of outputs;
a first channel coupled to a first portion of the plurality of inputs located on a first side of the function block and coupled to a first portion of the plurality of outputs located on the first side of the function block;
a second channel coupled to a second portion of the plurality of inputs located on a second side of the function block, the second side opposite the first side, and coupled to a second portion of the plurality of outputs located on the second side of the function block;
a third channel coupled to the first channel and the second channel and coupled to a third portion of the plurality of inputs located on a third side of the function block and coupled to a third portion of the plurality of outputs located on the third side of the function block; and a fourth channel coupled to the first channel and the second channel and coupled to a fourth portion of the plurality of inputs located on a fourth side of the function block, the fourth side opposite the third side, and coupled to a fourth portion of the plurality of outputs located on the fourth side of the function block, wherein there is at least one of: (a) a difference between any two of a number of inputs of the first, second, third or fourth portion of the plurality of inputs, (b) a difference between any two of a number of outputs of the first, second, third or fourth portion of the plurality of outputs, and (c) a difference between any two of the number of inputs combined with the number of outputs of the first, second, third, or fourth portion of the plurality of inputs and outputs.

54. The integrated circuit of claim 53 wherein the number of the third plurality of wires within the third channel differs from the number of the fourth plurality of wires within the fourth channel.

55. The integrated circuit of claim 53 wherein there is a difference between any two of: (a) a number of at least one input multiplexer and at least one wire driving device associated with the first channel, (b) a number of at least one input multiplexer and at least one wire driving device associated with the second channel, (c) a number of at least one input multiplexer and at least one wire driving device associated with the third channel, or (d) a number of at least one input multiplexer and at least one wire driving device associated with the fourth channel.

56. The integrated circuit of claim 53 wherein a number of at least one input multiplexer and at least one wire driving device associated with the third channel is different than a number of at least one input multiplexer and at least one wire driving device associated with the fourth channel.

57. The integrated circuit of claim 53 wherein the function block has a rectangular layout.

58. The integrated circuit of claim 53 wherein there is at least one of: (a) a difference between the number of inputs of the third and fourth portions of the plurality of inputs, (b) a difference between the number of outputs of the third and fourth portions of the plurality of outputs, and (c) a difference between the number of inputs combined with the number of outputs of the third and fourth portions of the plurality of inputs and outputs.

59. The integrated circuit of claim 53 wherein there is a difference between any two of: (a) a number of a first plurality of wires within the first channel, (b) a number of a second plurality of wires within the second channel, (c) a number of a third plurality of wires within the third channel, or (d) a number of a fourth plurality of wires within the fourth channel.

60. A method to interconnect a function block within a programmable logic array, comprising:

transmitting and receiving signals between a first portion of a plurality of pins on a first side of the function block and a first channel;

transmitting and receiving signals between a second portion of the plurality of pins on a second side of the function block and a second channel, the second side opposite the first side;

transmitting and receiving signals between a third portion of the plurality of pins on a third side of the function block and a third channel;

preventing transmission and receipt of signals between the function block and a fourth channel associated with a fourth side of the function block, the fourth side opposite the third side; and differing any two of a number of pins of the first portion of the plurality of pins, a number of pins of the second portion of the plurality of pins, or a number of pins of the third portion of the plurality of pins.

61. The method of claim 60 further comprising driving a signal on a particular one of a plurality of wires within the first channel, the second channel, or the third channel up to the length of the particular one of the plurality of wires away.

62. The method of claim 60 further comprising at least one of: (a) driving a first signal, transmitted by the function block, on a particular one of a plurality of wires within the first channel, the second channel, or the third channel up to the length of the particular one of the plurality of wires minus the length of the function block away, (b) driving a second signal, transmitted by another function block, on the particular one of the plurality of wires up to the length of the particular one of the plurality of wires away, and (c) receiving, by the function block, the first signal or the second signal on the particular one of the plurality of wires.

63. The method of claim 60 further comprising coupling a particular one of the plurality of pins of the function block to the third channel and at least one of the first channel and the second channel.

64. The method of claim 60 further comprising directly coupling a particular one of the plurality of pins of the function block to a particular one of a plurality of pins of another function block.

65. The method of claim 60 further comprising differing any two of: (a) a number of a first plurality of wires within the first channel, (b) a number of a second plurality of wires within the second channel, or (c) a number of a third plurality of wires within the third channel.

66. The method of claim 60 further comprising at least one of: (a) driving a signal on a particular one of a plurality of wires within the first channel, the second channel, or the third channel up to a length of the particular one of the plurality of wires minus a length of the function block away, and receiving the signal on the particular one of the plurality of wires.

67. A stubbing layout of an integrated circuit, comprising:

a first function block having a plurality of output stubs oriented in a first direction and a plurality of inputs;

a first channel oriented in a second direction, a first one of the plurality of inputs and a first one of the plurality of output stubs oriented in the first direction coupled to at least one wire stub corresponding to at least one wire within a first channel;

a second channel oriented in the second direction, a second one of the plurality of inputs and a second one of the plurality of output stubs oriented in the first direction coupled to at least one wire stub corresponding to at least one wire within the second channel; and a third channel oriented in the first direction, a third one of the plurality of inputs and a third one of the plurality of output stubs oriented in the first direction coupled to at least one wire within the third channel.

68. The stubbing layout of claim 67 further comprising a first region that includes at least one input multiplexer, each of the at least one input multiplexer oriented in the second direction, and each of the at least one input multiplexer having a plurality of inputs and an output, at least one of the plurality of inputs coupled to at least one of: (a) a particular one of the plurality of output stubs oriented in the first direction of the first function block, (b) a first one of the at least one wire stub corresponding to the at least one wire within the first channel, (c) a first one of the at least one wire stub corresponding to the at least one wire within the second channel, and (d) a first one of the at least one wire within the third channel, and the output of a particular one of the at least one input multiplexer coupled to a particular one of the plurality of inputs of the first function block; and a second region that includes at least one wire driving device, each of the at least one wire driving device oriented in the second direction, and each of the at least one wire driving device having a plurality of inputs and an output, at least one of the plurality of inputs coupled to at least one of: (a) a particular one of the plurality of output stubs oriented in the first direction of the first function block, (b) a second one of the at least one wire stub corresponding to the at least one wire within the first channel, (c) a second one of the at least one wire stub corresponding to the at least one wire within the second channel, and (d) a second one of the at least one wire within the third channel, and the output of a particular one of the at least one wire driving device coupled to any one of a third one of the at least one wire stub corresponding to the at least one wire of the first channel, a third one of the at least one wire stub corresponding to the at least one wire of the second channel, or a third one of the at least one wire within the third channel.

69. The stubbing layout of claim 68 wherein at least one of the plurality of inputs of the input multiplexer has an option track oriented in the second direction; and at least one of the plurality of inputs and the output of the wire driving device has an option track oriented in the second direction, wherein the first direction is perpendicular to the second direction.

70. The stubbing layout of claim 69 wherein at least one of a particular one of the plurality of output stubs of the first function block is coupled to a first option track oriented in the second direction of a first one of the plurality of inputs of a particular one of the at least one wire driving device that drives toward the first function block and a second option track oriented in the second direction of the output of the particular one of the at least one wire driving device is coupled to a third option track oriented in the second direction of a first one of the plurality of inputs of a particular one of the at least one input multiplexer that corresponds to the first function block;

the particular one of the plurality of output stubs of the first function block is coupled to a fourth option track oriented in the second direction of a particular one of the plurality of inputs of a particular one of the at least one wire driving device that drives away from the first function block, and the particular one of the plurality of output stubs of the first function block is coupled to a fifth option track oriented in the second direction of a second one of the plurality of inputs of the particular one of the at least one wire driving device that drives toward the first function block and a sixth option track oriented in the second direction of the output of the particular one of the at least one wire driving device is coupled to a seventh option track oriented in the second direction of a second one of the plurality of inputs of the particular one of the at least one input multiplexer that corresponds to the first function block, and a particular one of a plurality of output stubs of a second function block that is upstream from the first function block is coupled to an eighth option track oriented in the second direction of a third one of the plurality of inputs of the particular one of the at least one wire driving device that drives toward the first function block.

71. The stubbing layout of claim 69 wherein an option track oriented in the second direction of a particular one of the plurality of inputs of a particular one of the at least one input multiplexer that corresponds to the first function block is coupled to a particular one of a plurality of output stubs of a second function block.

72. The stubbing layout of claim 69 wherein an option track oriented in the second direction of a particular one of the plurality of inputs of a particular one of the at least one input multiplexer that corresponds to the first function block is coupled to a particular one of the plurality of output stubs of the first function block.

73. A digital system including the stubbing layout of the integrated circuit of claim 67.

74. The stubbing layout of claim 67 wherein a particular one of the plurality of inputs or a particular one of the plurality of output stubs of the first function block is coupled to at least two of a particular one of the at least one wire of the third channel, a particular one of the at least one wire stub corresponding to the at least one wire of the first channel, and a particular one of the at least one wire stub corresponding to the at least one wire of the second channel.

75. The stubbing layout of claim 67 wherein the first function blocks is a logic array block, a memory block, an input/output block, or a multiply-accumulate block.

* * * * *